US011728186B2

(12) United States Patent
Li et al.

(10) Patent No.: US 11,728,186 B2
(45) Date of Patent: Aug. 15, 2023

(54) DEVICE FOR CONVEYING AND DISPERSING SILICON WAFERS

(71) Applicant: HANGZHOU ZHONGWEI PHOTOELECTRIC TECHNOLOGY CO., LTD., Hangzhou (CN)

(72) Inventors: Hong Li, Hangzhou (CN); Hong Chen, Hangzhou (CN); Jun Wang, Hangzhou (CN); Jian Jing, Hangzhou (CN); Jiangshui Zhang, Hangzhou (CN); Guangquan Zhang, Hangzhou (CN); You Huang, Hangzhou (CN); Zhe Liu, Hangzhou (CN); Yongjian Fang, Hangzhou (CN)

(73) Assignee: HANGZHOU ZHONGWEI PHOTOELECTRIC TECHNOLOGY CO., LTD., Hangzhou (CN)

( * ) Notice: Subject to any disclaimer, the term of this patent is extended or adjusted under 35 U.S.C. 154(b) by 0 days.

(21) Appl. No.: 17/887,454

(22) Filed: Aug. 14, 2022

(65) Prior Publication Data

US 2023/0005774 A1   Jan. 5, 2023

Related U.S. Application Data

(63) Continuation of application No. PCT/CN2022/101206, filed on Jun. 24, 2022.

(30) Foreign Application Priority Data

Jul. 1, 2021   (CN) .......................... 202110746252.9
Aug. 2, 2021   (CN) .......................... 202110882181.5

(51) Int. Cl.
*H01L 21/02*  (2006.01)
*H01L 21/67*  (2006.01)
(Continued)

(52) U.S. Cl.
CPC .... *H01L 21/67051* (2013.01); *H01L 21/0206* (2013.01); *H01L 21/67706* (2013.01);
(Continued)

(58) Field of Classification Search
CPC .......... H01L 21/67051; H01L 21/0206; H01L 21/67706; H01L 21/67742;
(Continued)

(56) References Cited

U.S. PATENT DOCUMENTS 3,877,134 A * 4/1975 Shanahan ............... B23P 15/00
                                                       211/41.18
4,224,504 A * 9/1980 Erikson ............. H01L 21/67115
                                                         432/120
(Continued)

FOREIGN PATENT DOCUMENTS

CN    205303494 U    6/2016
CN    109545724 A    3/2019
(Continued)

OTHER PUBLICATIONS

International Search Report of PCT/CN2022/101206.
China Office Action of 202110882181.5.

*Primary Examiner* — Thomas Randazzo

(57) ABSTRACT

The present disclosure provides a device for conveying and dispersing a silicon wafer (100). The device for conveying and dispersing a silicon wafer (100) includes: a conveying component (20) configured for conveying a plurality of silicon wafers (200); a clamping component (10) disposed at two sides of the conveying component (20), the clamping component (10) being capable of clamping and conveying the plurality of silicon wafers (200); and a spraying component (30) disposed on the clamping component (10),
(Continued)

wherein after the plurality of silicon wafers (200) are conveyed to an end of the conveying component (20) proximal to the spraying component (30) via the conveying component (20) and the clamping component (10), the spraying component (30) is capable of spraying water on the plurality of silicon wafers (200) to separate adjacent two of the plurality of silicon wafers (200).

10 Claims, 6 Drawing Sheets

(51) Int. Cl.
    *H01L 21/677*     (2006.01)
    *H01L 21/687*     (2006.01)

(52) U.S. Cl.
    CPC .. *H01L 21/67742* (2013.01); *H01L 21/67766* (2013.01); *H01L 21/68707* (2013.01)

(58) Field of Classification Search
    CPC ......... H01L 21/67766; H01L 21/68707; H01L 21/67057; H01L 21/67313; H01L 21/67086; H01L 24/98; Y02P 70/50
    See application file for complete search history.

(56) References Cited

U.S. PATENT DOCUMENTS

| | | | | |
|---|---|---|---|---|
| 5,783,022 | A * | 7/1998 | Cha | B26F 3/004 |
| | | | | 156/941 |
| 5,976,954 | A * | 11/1999 | Kimura | H01L 21/67051 |
| | | | | 438/464 |
| 6,558,109 | B2 * | 5/2003 | Gibbel | B65G 47/918 |
| | | | | 414/797 |
| 2001/0046435 | A1 * | 11/2001 | Gibbel | B65G 47/918 |
| | | | | 414/797 |
| 2008/0146003 | A1 * | 6/2008 | Wang | B28D 5/0082 |
| | | | | 438/464 |
| 2012/0076633 | A1 * | 3/2012 | Renn | B65G 59/068 |
| | | | | 414/801 |
| 2022/0110347 | A1 * | 4/2022 | Leung | C12N 5/0697 |

FOREIGN PATENT DOCUMENTS

| | | | | |
|---|---|---|---|---|
| CN | 112850161 A | | 5/2021 | |
| CN | 113394150 A | | 9/2021 | |
| DE | 494673 A1 | * | 7/1992 | ....... H01L 21/67092 |
| DE | WO-2008003502 A1 | * | 1/2008 | .......... B28D 5/0082 |
| JP | WO-2004102654 A1 | * | 11/2004 | .......... B65H 3/0816 |
| JP | 2012119526 A | | 6/2012 | |

\* cited by examiner

DEVICE FOR CONVEYING AND DISPERSING SILICON WAFERS

CROSS-REFERENCE TO RELATED APPLICATIONS

This application is a continuation of international patent application No. PCT/CN2022/101206 filed on Jun. 24, 2022, which itself claims priority to Chinese patent application Nos. 202110746252.9, filed on Jul. 1, 2021, 202110882181.5, filed on Aug. 2, 2021, in the China National Intellectual Property Administration. The contents of the above identified applications are hereby incorporated herein in their entireties by reference.

TECHNICAL FIELD

The present disclosure relates to the field of a silicon slice processing, and in particular, to a device for conveying and dispersing silicon wafers.

BACKGROUND

A device for conveying and dispersing silicon wafers is used for conveying silicon wafers to a designated region and then separating the silicon wafers.

In the related art, silicon wafers are placed in a clip of a device for conveying and dispersing silicon wafers, and then put on a conveying component for transmission. Because the clip cannot hold the silicon wafers, front silicon wafers may press back silicon wafers along a conveying direction of the conveying component, resulting in no gaps between the silicon wafers. Therefore, it is difficult to separate the silicon wafers during spraying water on the silicon wafers, and it may require a large spraying force to separate the silicon wafers. However, a large spraying force may cause damage to the silicon wafers, and in addition, fine wire-cut particles on the front silicon wafers may cause the back silicon wafers to crack or break.

SUMMARY

According to various embodiments of the present disclosure, a device for conveying and dispersing silicon wafers is provided. The device for conveying and dispersing silicon wafers includes a conveying component, a clamping component, and a spraying component. The conveying component is configured for conveying a plurality of silicon wafers. The clamping component is disposed at two sides of the conveying component. An accommodating region for accommodating the plurality of silicon wafers is formed between the conveying component and the clamping component, and the clamping component is capable of clamping and conveying the plurality of silicon wafers. The spraying component is disposed on the clamping component. After the plurality of silicon wafers are conveyed to an end of the conveying component proximal to the spraying component via the conveying component and the clamping component, the spraying component is capable of spraying water on the plurality of silicon wafers to separate adjacent two of the plurality of silicon wafers.

In an embodiment, the clamping component includes a first support, a first belt, a second support, and a second belt. The first support and the second support are disposed at the two sides of the conveying component. The first belt is sleeved on the first support and capable of moving on the first support, and the second belt is sleeved on the second support and capable of moving on the second support. The first belt is matched with the second belt to clamp the plurality of silicon wafers.

In an embodiment, the clamping component includes a clamping driving unit. The clamping component is connected with the first support and the second support, respectively, and is capable of driving the first support and the second support to move, in order to change a volume of the accommodating region.

In an embodiment, the conveying component includes a third driving unit, a third belt, and a third support. The third belt is sleeved on the third support, and a third driving unit is capable of driving the third belt to move.

In an embodiment, an end of the third belt proximal to the spraying component of is provided a buffering region. The first belt, the second belt, and the third belt are capable of conveying the plurality of silicon wafers from the accommodating region to the buffering region. The first belt, the second belt are further capable of releasing a clamping of the plurality of silicon wafers in the buffering region, and the spraying component is capable of spraying water on the plurality of silicon wafers in the buffering region.

In an embodiment, the number of the third belt is one. A secondary belt is located beside two side of the third belt, respectively. The buffering region is defined by the secondary belt.

In an embodiment, the number of the third belt is one. The end of the third belt proximal to the spraying component is provided the buffering region. An end of the clamping component is provided a guiding part, and the guiding part is capable of guiding the plurality of silicon wafers located in the buffering region.

In an embodiment, the number of the third belt is two, and two third belts are separated from each other. The buffering region is defined by ends of the two third belts proximal to the spraying component.

In an embodiment, the number of the third belt is two, and two third belts are separated from each other. The buffering region is defined by ends close to the spraying component of the two third belts.

In an embodiment, the spraying component includes a first nozzle and a second nozzle. A distance between the first nozzle and the clamping component along a height direction of the device is different from a distance between the second nozzle and the clamping component along the height direction of the device. The first nozzle is away from the clamping component with respect to the second nozzle.

In an embodiment, the number of the second nozzle is multiple, and a plurality of second nozzles are disposed in parallel along a length direction of the clamping component.

Details of one or more embodiments of the present disclosure are set forth in the drawings and the description below. Other features, objects, and advantages of the present disclosure will become apparent from the specification, the drawings and the claims.

BRIEF DESCRIPTION OF THE DRAWINGS

In order to better describe and explain the embodiments and/or examples of those disclosures disclosed herein, one or more drawings may be referred to. The additional details or examples used to describe the drawings should not be considered as limiting the scope of any of the disclosed disclosures, the currently described embodiments and/or examples, and the best mode of these disclosures currently understood.

Figure 1:
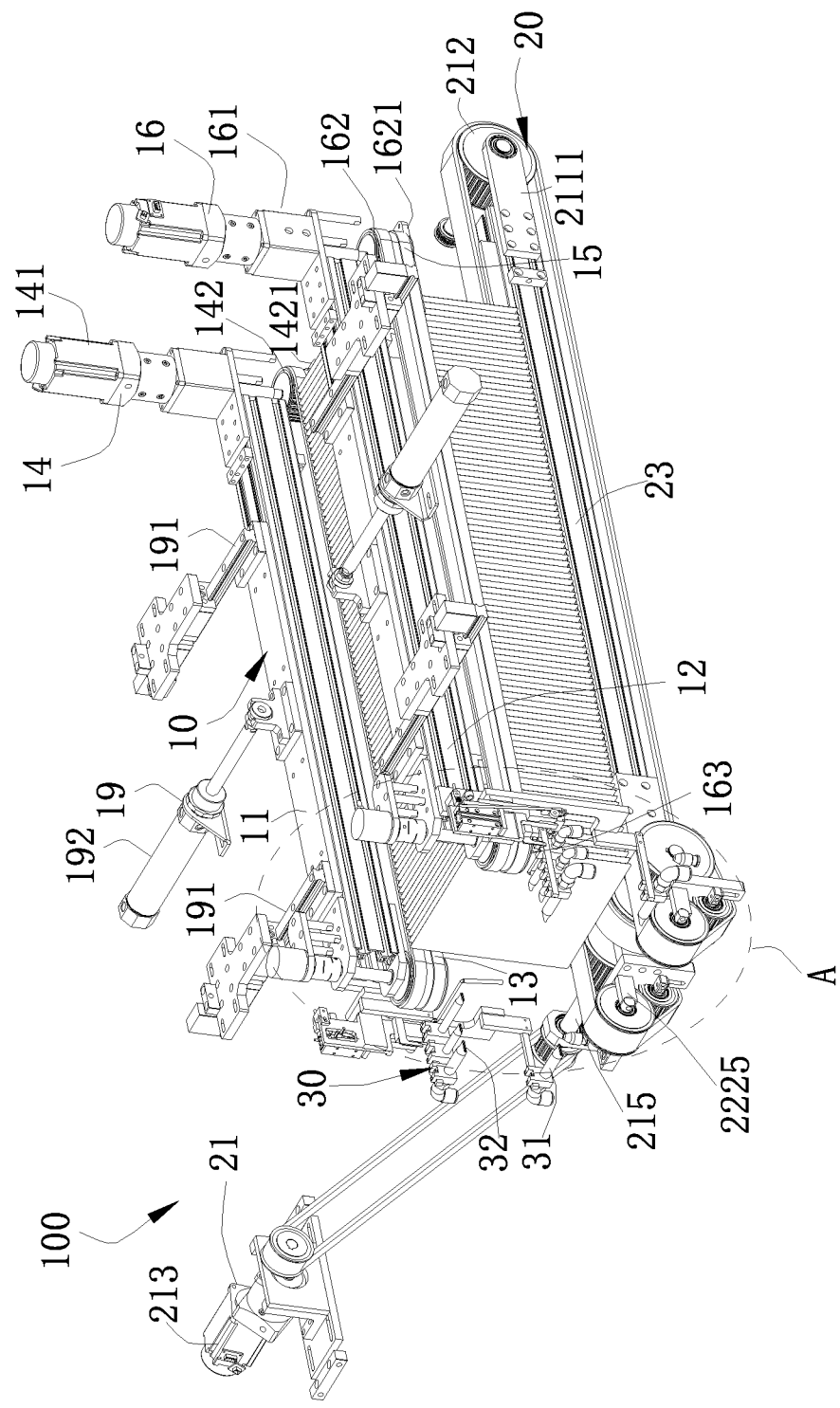
FIG. 1 is a schematic diagram of a device for conveying and dispersing silicon wafers according to one or more embodiments.

Description of reference numerals in the drawings are as follows. 100 represents a device for conveying and dispersing silicon wafers; 10 represents a clamping component; 101 represents an accommodating region; 11 represents a first support; 111 represents a mating section; 12 represents a second support; 13 represents a first belt; 131 represents a first end; 132 represents a second end; 14 represents a first driving unit; 141 represents a first motor; 142 represents a first driving wheel; 1421 represents a first connecting member; 143 represents a first driven wheel; 15 represents a second belt; 16 represents a second driving unit; 161 represents a second motor; 162 represents a second driving wheel; 1621 represents a second connecting member; 163 represents a second driven wheel; 17 represents a first support plate; 19 represents a clamping driving unit; 191 represents a clamping guide; 192 represents a clamping driving member; 20 represents a conveying component; 21 represents a third driving unit; 211 represents a third driving wheel; 2111 represents a third connecting member; 212 represents a third driven wheel; 213 represents a third motor; 214 represents a first wheel; 215 represents a transmission shaft; 22 represents a third belt; 221 represents a buffering region; 222 represents a secondary belt; 2221 represents a fourth driving wheel; 2222 represents a fourth driven wheel; 2223 represents a tensioning wheel; 2224 represents a fixed plate; 2225 represents a fifth connecting member; 2226 represents a sixth connecting member; 23 represents a third support; 231 represents a third support plate; 30 represents a spraying component; 31 represents a first nozzle; 32 represents a second nozzle; 40 represents a guiding part; 200 represents silicon wafers.

DETAILED DESCRIPTION

Hereinafter, the technical solutions in the embodiments of the present disclosure will be clearly and completely described with reference to the accompanying drawings in the embodiments of the present disclosure. Apparently, the described embodiments are merely a part of the embodiments of the present disclosure, rather than all of the embodiments. Based on the embodiments of the present disclosure, all other embodiments obtained by one of ordinary skill in the art without creative efforts all belong to the scope of protection of the present disclosure.

It should be noted that when a component is referred to as being "arranged" on another component, it may be directly arranged on the other component or an intervening component may be presented. When a component is considered to be "disposed" on another component, it may be directly disposed on the other component or an intervening component may be presented at the same time. When a component is considered to be "fixed" to another component, it may be directly fixed to the other component or an intervening component may be presented at the same time.

Unless otherwise defined, all technical and scientific terms used herein have the same meaning as commonly understood by one of ordinary skill in the art to which the present disclosure pertains. The terminology used in the specification of the present disclosure is for the purpose of describing particular embodiments only and is not intended to limit the present disclosure. As used herein, the term "or/and" may include any and all combinations of one or more associated listed items.

Figure 3:
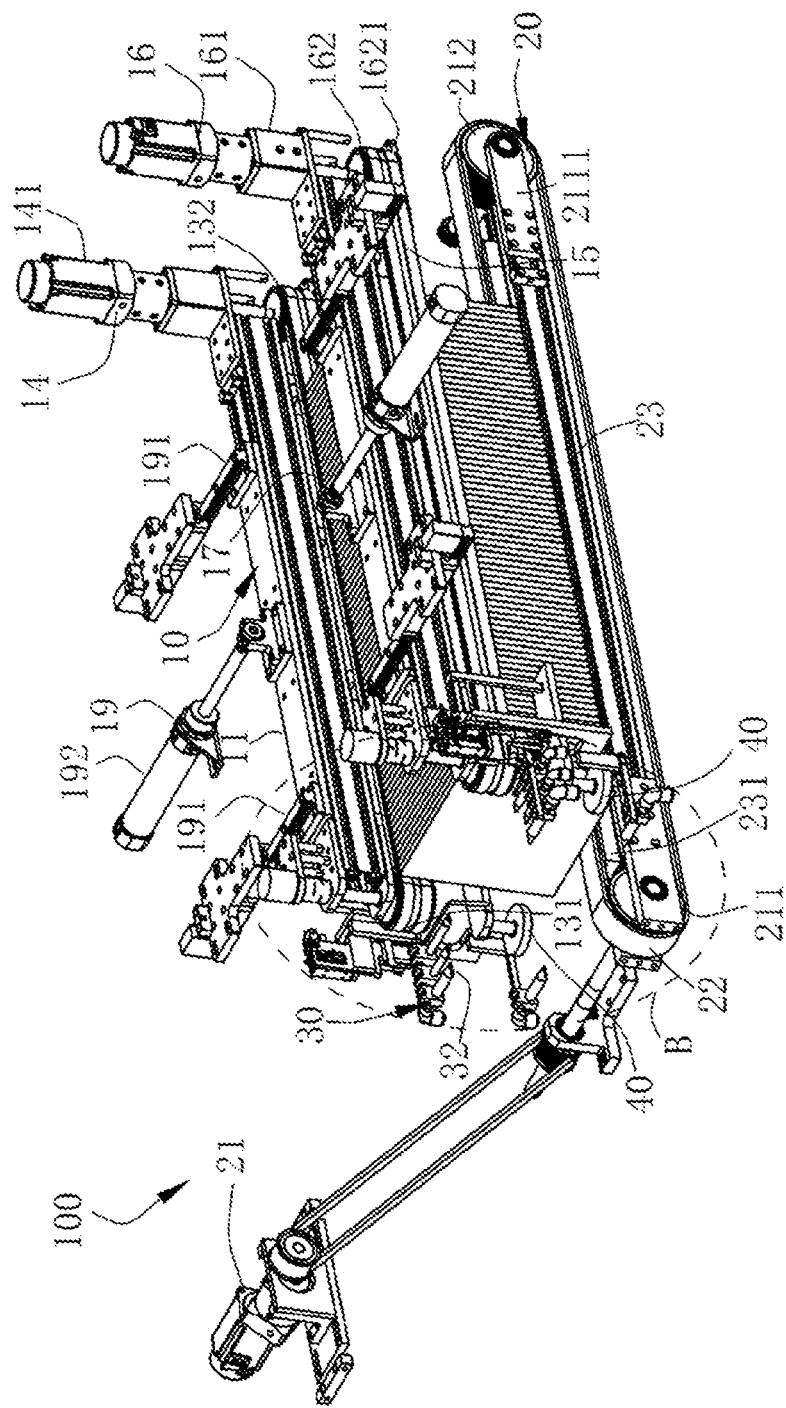
FIG. 3 is a schematic diagram of a device for conveying and dispersing silicon wafers according to one or more embodiments.
Figure 5:
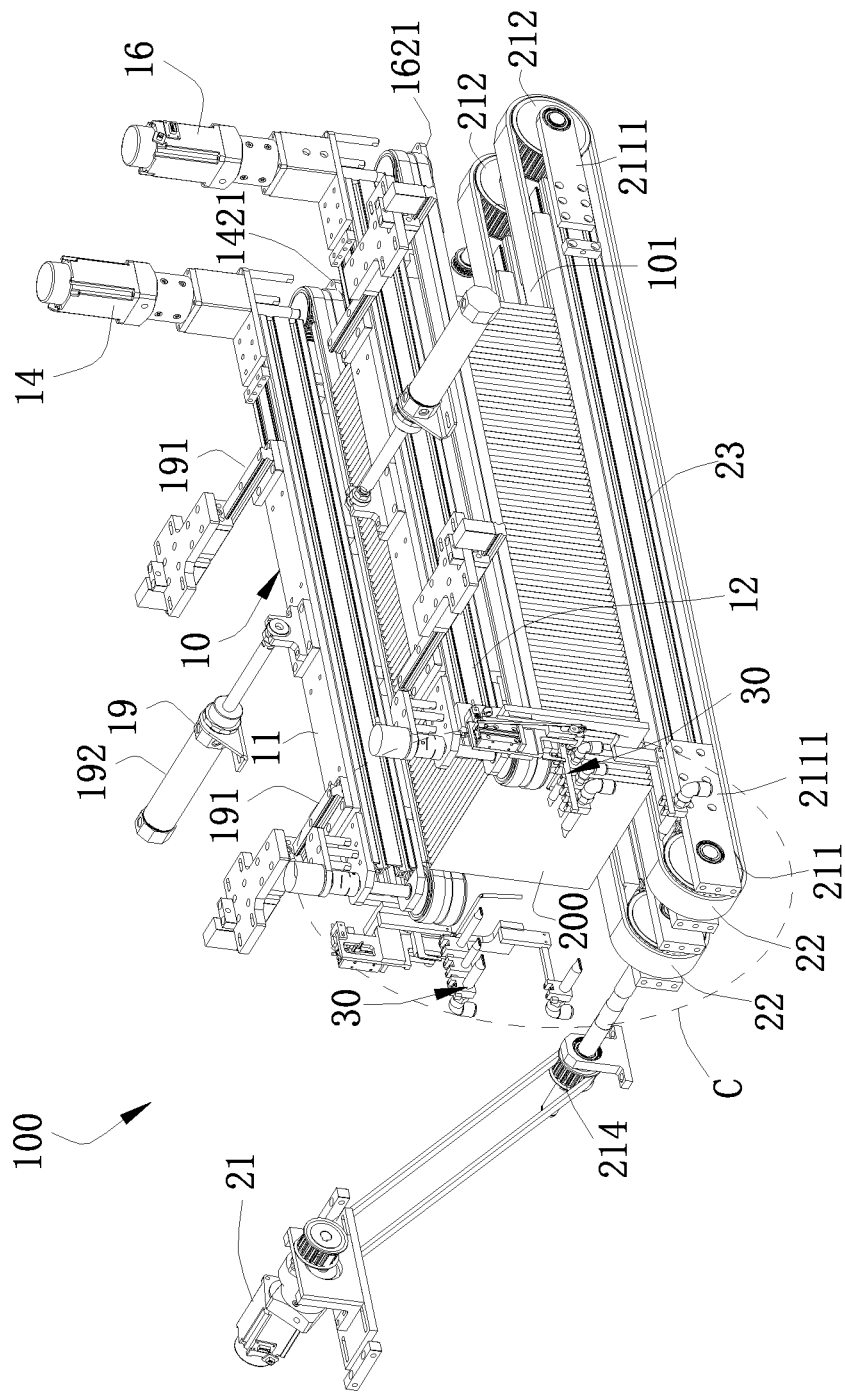
FIG. 5 is a schematic diagram of a device for conveying and dispersing silicon wafers according to one or more embodiments.

Referring to FIG. 1, FIG. 3, and FIG. 5, a device 100 for conveying and dispersing silicon wafers provided by the present disclosure is configured for conveying and dispersing silicon wafers 200.

Specifically, the device 100 for conveying and dispersing silicon wafers may include a clamping component 10, a conveying component 20, and a spraying component 30. The clamping component 10 may be disposed at two sides of the conveying component 20. An accommodating region 101 may be formed between the clamping component 10 and the conveying component 20. The silicon wafers 200 may be placed in the accommodating region 101. Since the conveying component 20 can be driven, the clamping component 10 may clamp the silicon wafers 200 and convey the silicon wafers 200 by a driving of the conveying component 20, such that the silicon wafers 200 can be clamped and conveyed to an end of the conveying component 20 proximal to the spraying component 30. The spraying component 30 may be connected to the clamping component 10 to spray water on the silicon wafers 200, so that adjacent silicon wafers 200 can be separated from each other.

As such, the silicon wafers 200 may be clamped by the clamping component 10, so that front silicon wafers 200 may not apply forces to back silicon wafers 200. Thus, the front silicon wafers 200 and the back silicon wafers 200 may keep gaps therebetween without abutting each other. In addition, spraying forces for spraying subsequent wafers 200 may be reduced. Thus, the silicon wafers 200 can be easily separated when water is sprayed thereon, and the silicon wafers 200 may be protected from being damaged by large spraying forces. Meanwhile, back silicon wafers 200 may be protected from being damaged by abutting of front silicon wafers 200, and the back silicon wafers 200 may not be worn by fine particles on the front silicon wafers 200, such that the back silicon wafers 200 may remain intact and may be prevented from cracking or breaking.

The clamping component 10 may include a first support 11 and a second support 12 which are parallel to each other. The first support 11 and the second support 12 may be disposed at the two sides of the conveying component 20, respectively.

The clamping component 10 may further include a first belt 13, a first driving unit 14, a second belt 15, and a second driving unit 16. The first driving unit 14 may be connected to the first support 11, and the second driving unit 16 may be connected to the second support 12. The first belt 13 and the second belt 15 may be disposed at two sides of the silicon wafers 200. The first driving unit 14 is capable of driving the first belt 13 to drive, and the second driving unit 16 is capable of driving the second belt 15 to drive. The first belt 13 and the second belt 15 is capable of clamping the silicon wafers 200, and cooperating with the conveying component 20 to convey the silicon wafers 200.

In the present embodiment, the first driving unit 14 may include a first motor 141, a first driving wheel 142, and a first driven wheel 143. The first driving wheel 142 may be disposed at an end away from the spraying component 30 of the first support 11. The first driven wheel 143 may be disposed at an end away from the first driving wheel 142 of the first support 11. The first belt 13 may be disposed outside the first support 11, the first driving wheel 142, and the first driven wheel 143. An output shaft of the first motor 141 may be connected to the first driving wheel 142 to drive the first driving wheel 142 to rotate. The first driving wheel 142 may drive the first driven wheel 143 to rotate via the first belt 13. In other embodiments, a rotary cylinder may further be employed to drive the first driving wheel 142 to rotate.

In the present embodiment, the second driving unit 16 may include a second motor 161, a second driving wheel 162, and a second driven wheel 163. The second driving wheel 162 may be disposed at an end away from the spraying component 30 of the second support 12. The second driven wheel 163 may be disposed at an end away from the second driving wheel 162 of the second support 12. The second belt 15 may be disposed outside the second support 12, the second driving wheel 162 and the second driven wheel 163. An output shaft of the second motor 161 may be connected to the second driving wheel 162 and configured to drive the second driving wheel 162 to rotate. The second driving wheel 162 may drive the second driven wheel 163 to rotate via the second belt 15. In other embodiments, a rotary cylinder may further be employed to drive the second driving wheel 162 to rotate.

A first support plate 17 may be disposed at an inner side of the first support 11. The first support plate 17 may be disposed between the first support 11 and the first belt 13, so as to support the first belt 13. A second support plate (not shown) may be disposed at an inner side of the second support 12. The second support plate may be disposed between the second support 12 and the second belt 15, so that the first belt 13 and the second belt 15 may better clamp the silicon wafers 200.

The first belt 13 may be disposed at a side of the first support 11, and the second belt 15 may be disposed at a side of the second support 12. An end away from the first support 11 of the first driving wheel 142 and an end away from the first support 11 of the first driven wheel 143 may be provided with a first connecting member 1421, respectively. An end of the first connecting member 1421 provided at the first driving wheel 142 may be fixed and connected to the first support 11, and the other end thereof may be rotatably connected to the first driving wheel 142 to support the first driving wheel 142. An end of the first connecting member 1421 provided at the first driven wheel 143 may be fixed and connected to the first support 11, and the other end thereof may be rotatably connected to the first driven wheel 143 to support the first driven wheel 143. An end away from the second support 12 of the second driving wheel 162 and an end away from the second support 12 of the second driven wheel 163 may be provided with a second connecting member 1621, respectively. An end of the second connecting member 1621 provided at the second driving wheel 162 may be fixed and connected to the second support 12, and the other end thereof may be rotatably connected to the second driving wheel 162 to support the second driving wheel 162. An end of the second connecting member 1621 provided at the second driven wheel 163 may be fixed and connected to the second support 12, and the other end thereof may be rotatably connected to the second driven wheel 163 to support the second driven wheel 163.

The clamping component 10 may further include a clamping driving unit 19. The clamping driving unit 19 may be connected to the first support 11 and the second support 12, respectively, so that the first support 11 and the second support 12 can move towards or opposite to each other, thereby changing a volume of the accommodating region 101. Accordingly, the first support 11 and the second support 12 may be released before receiving the silicon wafers 200, such that when the first belt 13 and the second belt 15 may be released, the silicon wafers 200 can enter the clamping component 10, and then the silicon wafers 200 may be clamped.

The clamping driving unit 19 may include a clamping guide 191 and a clamping driving member 192. The clamping guide 191 may be connected to the first support 11 and the second support 12, respectively. In addition, the clamping driving member 192 may be connected to the first support 11 and the second support 12, respectively. Both of the first support 11 and the second support 12 may be provided with a mating section 111. Each mating section 111 may move along the clamping guide 191. The clamping driving member 192 may drive the first support 11 and the second support 12 to move along a width direction of the first support 11 and a width direction of the second support 12, respectively. It should be noted that the width direction of the first support 11 and the width direction of the second support 12 in the present disclosure refers to a direction of a line which connects a center of the first support 11 and a center of the second support 12.

In the present embodiment, the number of the clamping driving unit 19 may be two. One of the two clamping driving units 19 is connected to the first support 11, and the other of the two clamping driving units 19 is connected to the second support 12. In addition, the number of the clamping guide 191 may be four. Two of the four clamping guides 191 may be disposed proximal to both ends of the first support 11, respectively. The first support 11 may be provided with two mating sections 111, so that the first support 11 may move more smoothly. The other two of the four clamping guides 191 may be disposed proximal to both ends of the second support 12, respectively. The second support 12 may be provided with two mating sections 111, so that the second support 12 may move more smoothly. The clamping driving member 192 may be two cylinders, in which a telescopic shaft of one cylinder may be connected to the first support 11, and a telescopic shaft of the other cylinder may be connected to the second support 12, so as to drive the first support 11 and the second support 12 to move, respectively. In other embodiments, the number of clamping guide 191 may be 2, 3, 5, or more, and the number of clamping driving member 192 may be 3, 4, or more. In addition, the clamping driving member 192 may be a motor.

The conveying component 20 may include a third driving unit 21, a third belt 22, and a third support 23. The third belt 22 may be sleeved outside the third support 23. The third driving unit 21 is capable of driving the third belt 22 for conveying. The silicon wafers 200 may be placed on the third belt 22.

The third driving unit 21 may include a third driving wheel 211 and a third driven wheel 212 which are disposed at both ends of the third support 23, respectively. The third belt 22 may be sleeved outside the third driving wheel 211 and the third driven wheel 212. The third driving wheel 211 may drive the third driven wheel 212 to rotate via the third belt 22.

In the present embodiment, the third driving unit 21 may further include a third motor 213, a first wheel 214 and a transmission shaft 215. An output shaft of the third motor 213 may be provided with a rotating wheel, which may drive the first wheel 214 to rotate via a belt. The first wheel 214 may be connected to the third driving wheel 211 via the transmission shaft 215, thereby driving the third driving wheel 211 to rotate. In other embodiments, the third motor 213 may be replaced by a rotary cylinder, or the third motor 213 may also directly drive the first wheel 214 to rotate.

Both sides of the third driving wheel 211 and both sides of the third driven wheel 212 may be provided with third connectors 2111. An end of the third connecting member 2111 provided at the third driving wheel 211 may be fixed and connected to the third support 23, and the other end thereof may be rotatably connected to the third driving wheel 211 to support the third driving wheel 211. An end of the third connecting member 2111 provided at the third driven wheel 212 may be fixed and connected to the third support 23, and the other end thereof may be rotatably connected to the third driven wheel 212 to support the third driven wheel 212.

A third support plate 231 may be disposed at a side of the third support 23 facing the first support 11 and the second support 12. The third support plate 231 may be disposed between the third support 23 and the third belt 22 to support the third belt 22.

A buffering region 221 may be defined at an end of the third belt 22 proximal to the spraying component 30. The first belt 13 and the second belt 15 may transfer the silicon wafers 200 to the buffering region 221. In the buffering region 221, the first belt 13 and the second belt 15 may release a clamping of the silicon wafers 200. That is, the first belt 13 may have first ends 131 disposed opposite to each other, and the second belt 15 may have second ends 132 disposed opposite to each other, the second ends 132 being away from the spraying component 30 with respect to the first ends 131. The buffering region 221 may protrude in a direction away from the second ends 132 with respect to the first belt 13 and the second belt 15. The spraying component 30 may spray water on the silicon wafers 200 in the buffering region 221. At this time, the silicon wafers 200 may break away from a clamping of the first belt 13 and the second belt 15, and the spraying component 30 may spray water on the silicon wafers 200, so that the silicon wafers 200 may be fan-shaped and dumped onto a wafer inserting head (not shown).

As such, the silicon wafers 200 may be separated from the first belt 13 and the second belt 15 after entering the buffering region 221, so that the silicon wafers 200 can be toppled towards a direction away from silicon wafers 200 behind. Therefore, a successful separation of the silicon wafers 200 may be realized.

When the conveying component 20 lifts the silicon wafers 200 from a material frame, the silicon wafers 200 may be placed vertically on the third belt 22, and may be conveyed vertically to the buffering region 221 by a synchronous convey of the third belt 22, the first belt 13, and the second belt 15. Alternatively, the silicon wafers 200 may be placed obliquely on the third belt 22, and may be conveyed obliquely to the buffering region 221 by a synchronous convey of the third belt 22, the first belt 13, and the second belt 15. Alternatively, the silicon wafers 200 may be placed vertically on the third belt 22 and conveyed synchronously by the third belt 22, the first belt 13, and the second belt 15, and when the silicon wafers 200 approaches the buffering region 221, the silicon wafers 200 may be sent obliquely to the buffering region 221. The silicon wafers 200 may be tilted in the following manners. When driving the third driving unit 21 firstly and then driving the first driving unit 14 and the second driving unit 16, the third belt 22 may run ahead of the first belt 13 and the second belt 15. Alternatively, the first belt 13 and the second belt 15 are driven to move in an opposite direction for a certain distance by the first driving unit 14 and the second driving unit 16. Alternatively, when the silicon wafers 200 are vertically conveyed proximal to the buffering region 221, a speed of the first belt 13 and that of the second belt 15 may be slowed down, or a conveyance of the first belt 13 and the second belt 15 may be stopped, so that the silicon wafers 200 may be inclined at a certain angle towards the second ends 132.

Embodiment 1

Figure 2:
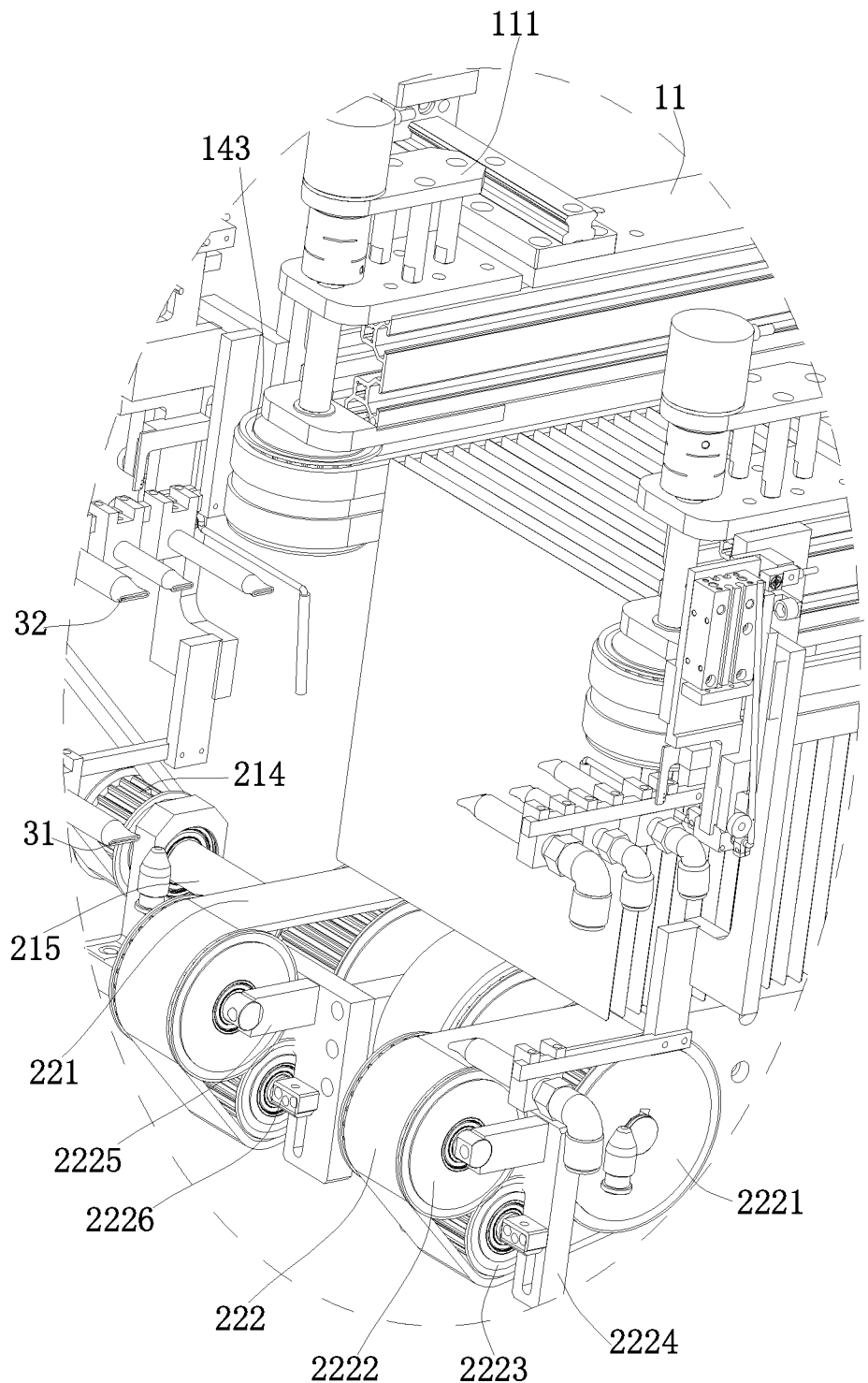
FIG. 2 is a partial enlarged view of a portion "A" in FIG. 1.

Referring to FIG. 1 and FIG. 2, the number of the third belt 22 may be one. One or more secondary belts 222 may be located beside both sides of an end of the third belt 22 proximal to the spraying component 30. The buffering region 221 may be defined by the secondary belt 222.

As such, the silicon wafers 200 may be successfully separated.

At an end adjacent to the spraying component 30, the third belt 22 may be retracted with respect to the secondary belt 222. The secondary belt 222 may protrude in a direction away from the second end 132 with respect to the first belt 13 and the second belt 15, and thus the buffering region 221 may be defined by a protrusion part of the secondary belt 222.

The secondary belt 222 may be made of a material having a friction coefficient less than 0.3. A friction coefficient of the third belt 22 may be greater than that of the secondary belt 222. When the silicon wafers 200 are transferred to the secondary belt 222, the spraying component 30 may spray water on the secondary belt 222, and thus a smooth secondary belt 222 can successfully separate a silicon wafer 200 from a subsequent silicon wafer 200.

The secondary belt 222 may be provided with a fourth driving wheel 2221, a fourth driven wheel 2222 and a tensioning wheel 2223. The fourth driving wheel 2221 may be connected to a transmission shaft 215. The transmission shaft 215 may drive the fourth driving wheel 2221 to rotate, and the fourth driving wheel 2221 may drive the fourth driven wheel 2222 to rotate, thereby realizing a transmission of the secondary belt 222. The tensioning wheel 2223 is configured for tensioning the secondary belt 222.

Both sides of the secondary belt 222 may be provided with a fixed plate 2224, respectively. A fifth connecting member 2225 and a sixth connecting member 2226 may be provided on the fixed plate 2224. An end of the fifth connecting member 2225 may be fixed and connected to the fixed plate 2224, and the other end thereof may be rotatably connected to the fourth driven wheel 2222. An end of the sixth connecting member 2226 may be fixed and connected to the fixed plate 2224, and the other end thereof may be rotatably connected to the tensioning wheel 2223, thereby supporting the fourth driven wheel 2222 and the tensioning wheel 2223.

Embodiment 2

Figure 4:
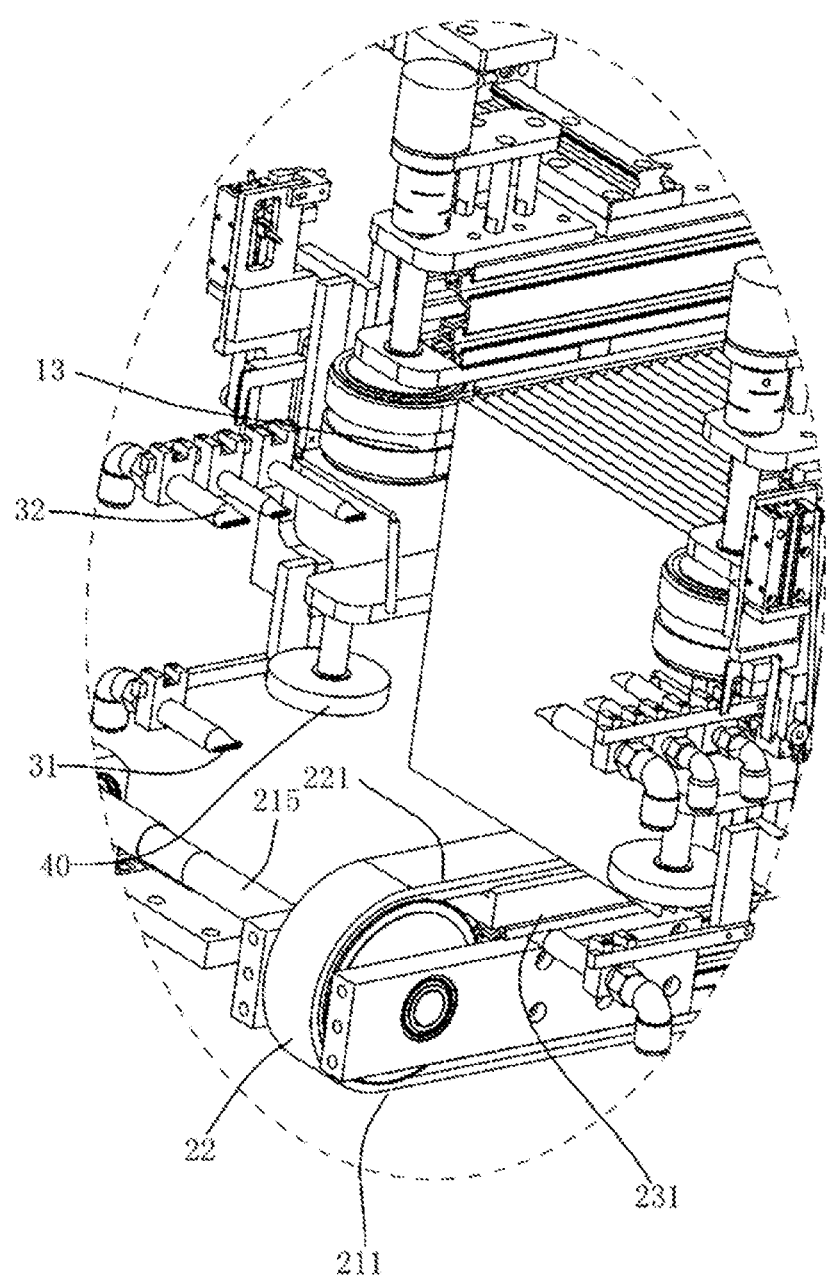
FIG. 4 is a partial enlarged view of a portion "B" in FIG. 3.

Referring to FIG. 3 and FIG. 4, a structure of a device for conveying and dispersing silicon wafers of the present embodiment is substantially the same as that of the device for conveying and dispersing silicon wafers in Embodiment 1, and thus, similarities will be omitted, and differences are described as follows.

The number of the third belt 22 may be one, and the entire third belt 22 may be made of a material having a friction coefficient less than 0.3.

An end of the third belt 22 proximal to the spraying component 30 may protrude in a direction away from the second end 132 with respect to the first belt 13 and the second belt 15. A buffering region 221 may be defined by a protrusion part of the third belt 22. A smooth buffering region 221 may reduce a friction force on the silicon wafers 200, facilitating a separation of the silicon wafers 200.

An end of the first support 11 proximal to the spraying component 30 and an end of the second support 12 proximal to the spraying component 30 may be provided with a guiding part 40, respectively. The guiding parts 40 are capable of guiding the silicon wafers 200 to enter the buffering region 221, so as to prevent the silicon wafers 200 from losing support and toppling after being separated from the first belt 13 and the second belt 15.

Alternatively, the guiding parts 40 may be two guiding wheels which can reduce a friction force on the silicon wafers 200 and protect the silicon wafers 200 from being crushed.

Embodiment 3

Figure 6:
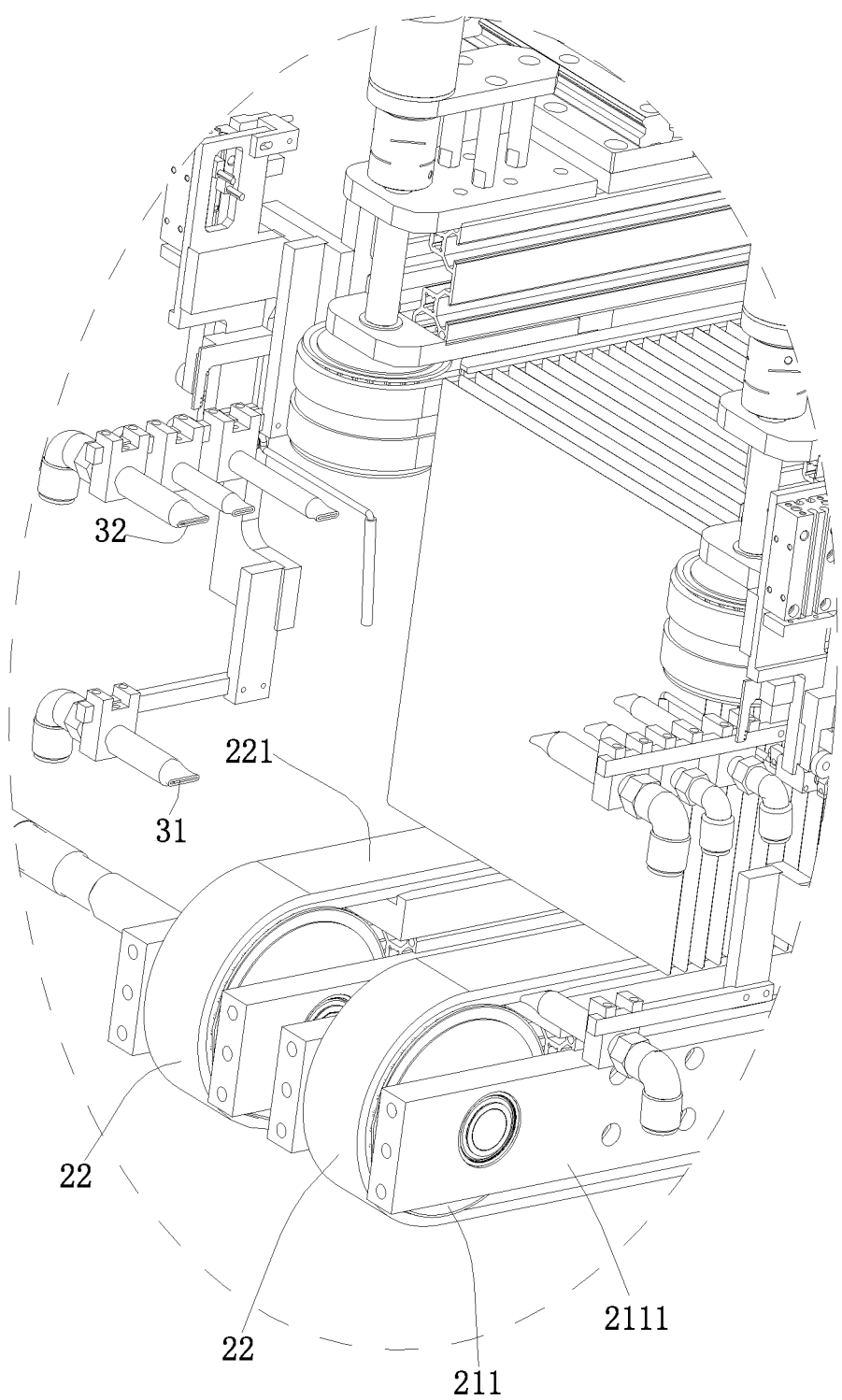
FIG. 6 is a partial enlarged view of a portion "C" in FIG. 5.

Referring to FIG. 5 and FIG. 6, a structure of a device for conveying and dispersing silicon wafers of the present embodiment is substantially the same as that of the device for conveying and dispersing silicon wafers in Embodiment 2, and thus, similarities will be omitted, and differences are described as follows.

The number of the third belt 22 may be two, and two third belts 22 may be separated from each other. An end adjacent to the spraying component 30 of the two third belts 22 may protrude in a direction away from the second ends 132 with respect to the first belt 13 and the second belt 15. Protrusion parts of the two third belts 22 may be defined as a buffering region 221.

Both the third belts 22 are made of a material having a friction coefficient less than 0.3. That is, both the third belts 22 are smooth, thereby reducing a friction force on the silicon wafers 200 and facilitating a separation of the silicon wafers 200.

The spraying component 30 may include a first nozzle 31 and a second nozzle 32. The first nozzle 31 may be disposed proximal to the third belt 22 with respect to the second nozzle 32, that is, the first nozzle 31 may be proximal to bottoms of the silicon wafers 200. When the first nozzle 31 may spray water on the bottoms of the silicon wafers 200, the bottoms of the silicon wafers 200 may be applied with forces. At this time, the silicon wafers 200 may be separated from the first belt 13 and the second belt 15, and an upper end of a silicon wafer 200 can be toppled away from adjacent silicon wafers 200. The second nozzle 32 may spray water on an upper end of a silicon wafer 200 to help separate the silicon wafer 200 from adjacent silicon wafers 200, and may control tilt angles of the silicon wafers 200, so that the silicon wafers 200 may be topped to an inserting head in a fan shape.

The number of second nozzle 32 may be multiple, and a plurality of second nozzles 32 may be disposed in parallel along a length direction of the third belt 22. An amount of water sprayed by the plurality of second nozzles 32 can be adjusted as required. The plurality of second nozzles 32 may cooperate with each other to control tilt angles of the silicon wafers 200. When spraying water, some of the plurality of second nozzles 32 closest to the second ends 132 among the first nozzles 31 and the second nozzles 32 may simultaneously spray water, so that a silicon wafer 200 may be separated from a following silicon wafer 200, and then the remaining of the plurality of second nozzles 32 may be controlled to start to spray water. Since an amount of water sprayed by the second nozzles 32 are different, the silicon wafers 200 can be more completely separated, and the tilt angles of the silicon wafers 200 can be controlled by cooperation of the second nozzles 32. It should be noted that a length direction of the clamping component 10 and that of the third belt 22 refer to an advancing/moving direction of the silicon wafers 200 on the third belt 22.

As such, a plurality of second nozzles 32 may cooperate with each other, so that the silicon wafers 200 may remain upright with a certain inclined angle.

In the present embodiment, the number of the first nozzle 31 may be two, and two first nozzles 31 may spray water on both sides of the silicon wafers 200, and the second nozzles 32 may spray water on both sides of the silicon wafers 200, which can ensure an amount and an uniformity of sprayed water, and also can prevent the first nozzles 31 and the second nozzles 32 from blocking the silicon wafers 200 to move forward.

During an operation, the device 100 for conveying and dispersing silicon wafers may be placed in a wafer inserting water tank. A material frame in which the silicon wafers 200 are placed may be placed on the device 100 for conveying and dispersing silicon wafers. The third belt 22 may extend from a bottom of the material frame to jack up the silicon wafers 200 and drive the clamping driving unit 19 to clamp the silicon wafers 200. The silicon wafers 200 may be conveyed to the buffering region 221 by the first belt 13, the second belt 15, and the third belt 22. The first nozzles 31 may spray water on bottoms of the silicon wafers 200, so that upper ends of the silicon wafers 200 tend to topple towards a direction away from the second ends 132. Then, the second nozzles 32 may spray water on the upper ends of the silicon wafers 200, so that current silicon wafers 200 may be separated from adjacent silicon wafers 200.

The technical features of the above-described embodiments may be combined in any combination. For the sake of brevity of description, all possible combinations of the technical features in the above embodiments are not described. However, as long as there is no contradiction between the combinations of these technical features, all should be considered as within the scope of this disclosure.

The above-described embodiments are merely illustrative of several embodiments of the present disclosure, and the description thereof is relatively specific and detailed, but is not to be construed as limiting the scope of the disclosure. It should be noted that a number of variations and modifications may be made by those skilled in the art without departing from the spirit and scope of the disclosure. Therefore, the scope of the disclosure should be determined by the appended claims.

We claim:

1. A device for conveying and dispersing silicon wafers, comprising:
   a conveying component configured for conveying a plurality of silicon wafers;
   a clamping component disposed at two sides of the conveying component along a conveying direction, wherein an accommodating region for accommodating the plurality of silicon wafers is formed between the conveying component and the clamping component, and the clamping component is configured to clamp the plurality of silicon wafers located in the accommodating region from sides of the plurality of silicon wafers arranged in a row and conveying the plurality of silicon wafers; and a spraying component disposed on the clamping component, wherein after the plurality of silicon wafers are conveyed to an end of the conveying component proximal to the spraying component via the conveying component and the clamping component, the spraying component is configured to spray water on the plurality of silicon wafers to separate adjacent two of the plurality of silicon wafers.

2. The device of claim 1, wherein the spraying component comprises a first nozzle and a second nozzle, a distance between the first nozzle and the clamping component along a height direction of the device is different from a distance between the second nozzle and the clamping component along the height direction of the device, the first nozzle is away from the clamping component with respect to the second nozzle.

3. The device of claim 2, wherein the spraying component comprises a plurality of second nozzles, and the plurality of second nozzles are arranged in parallel along a length direction of the clamping component.

4. The device of claim 1, wherein the clamping component comprises a first support, a first belt, a second support, and a second belt, the first support and the second support are disposed at the two sides of the conveying component, the first belt is sleeved on the first support and configured to move on the first support, the second belt is sleeved on the second support and configured to move on the second support, and the first belt is matched with the second belt to clamp the plurality of silicon wafers.

5. The device of claim 4, wherein the clamping component comprises a clamping driving unit, the clamping driving unit is connected with the first support and the second support, respectively, and the clamping driving unit is configured to drive the first support and the second support to move, in order to change a volume of the accommodating region.

6. The device of claim 4, wherein the conveying component comprises a third driving unit, a third belt, and a third support, the third belt is sleeved on the third support, and a third driving unit is configured to drive the third belt to move.

7. The device of claim 6, wherein an end of the third belt-close to proximal to the spraying component is provided a buffering region, the first belt, the second belt, and the third belt are configured to convey the plurality of silicon wafers from the accommodating region to the buffering region, the first belt and the second belt are further configured to release a clamping of the plurality of silicon wafers in the buffering region, and the spraying component is configured to spray water on the plurality of silicon wafers in the buffering region.

8. The device of claim 7, wherein the number of the third belt is one, a secondary belt is located beside two sides of the third belt, respectively, and the buffering region is defined by the secondary belt.

9. The device of claim 7, wherein the number of the third belt is one, the buffering region is defined by the end of the third belt proximal to the spraying component, an end of the clamping component is provided a guiding part, and the guiding part is configured to guide the plurality of silicon wafers located in the buffering region.

10. The device of claim 7, wherein the number of the third belt is two, two third belts are separated from each other, the buffering region is defined by ends of the two third belts proximal to the spraying component.

* * * * *